Sept. 2, 1958 T. A. PRUGH 2,850,630

TRANSISTOR MULTIVIBRATOR

Filed Feb. 16, 1955

INVENTOR

Thomas A. Prugh

BY

W. E. Thibodeau, A. W. Dew and J. D. Edgerton

ATTORNEYS

United States Patent Office 2,850,630

Patented Sept. 2, 1958

2,850,630

TRANSISTOR MULTIVIBRATOR

Thomas A. Prugh, Silver Spring, Md., assignor to the United States of America as represented by the Secretary of the Army Application February 16, 1955, Serial No. 488,730

4 Claims. (Cl. 250—36)

(Granted under Title 35, U. S. Code (1952), sec. 266)

The invention described herein may be manufactured and used by or for the Government for governmental purposes without the payment to me of any royalty thereon.

This invention relates to multivibrator circuits utilizing transistors, particularly those of the junction type. The invention provides an improved self-starting free-running multivibrator using junction transistors or other transistors having an alpha of less than unity.

Conventional free-running junction transistor multivibrators have at least two weaknesses: (1) they may not be self-starting, and (2) their frequency varies considerably with temperature, since the frequency-determining resistance-capacitance network is loaded by a temperature-dependent transistor resistance.

An object of my invention is to provide a free-running junction transistor multivibrator that is consistently self-starting—i. e., that consistently breaks into oscillation in response to the application of appropriate supply voltages.

Another object is to provide a free-running junction transistor multivibrator the frequency of which is substantially independent of transistor temperature.

Other objects, aspects, uses, and advantages of the invention will become apparent from the following description and from the accompanying drawing, in which—

Figure 1:
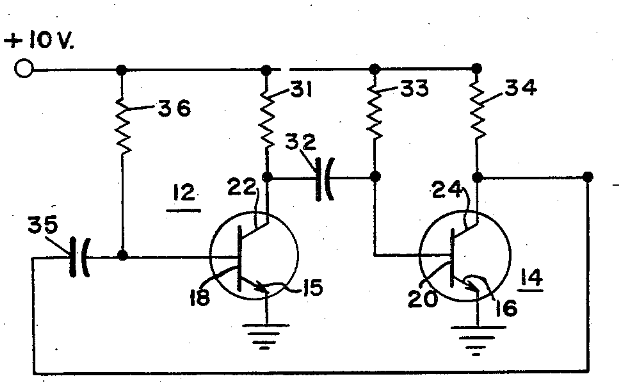
Figure 1 is a schematic diagram of a conventional junction transistor multivibrator.

In Fig. 1, two junction transistors 12 and 14 of the n-p-n type are connected in a conventional multivibrator circuit. Emitters 15 and 16 are grounded. Each transistor 12 or 14 is in the "on" condition—i. e., collector current flows in the circuit comprising collector 22 and base 18 or collector 24 and base 20—when the voltage at base 18 or 20 rises above a critical value. In a typical arrangement a supply voltage of about 10 volts is used, and the transistors switch "on" when the voltage at the base 18 or 20 rises to about zero volts. When the circuit is oscillating properly as a multivibrator, each time one of the transistors 12 or 14 is switched "on" it produces a negative-going output pulse that is applied ot the base of the second transistor 14 or 12 to switch that transistor "off." After a time determined by the time constants chosen, however, the voltage at the base of the second transistor 14 or 12 recovers positivewise sufficiently to switch the second transistor "on" again. When this happens the output of the second transistor switches the first transistor off. And so forth.

However, it will be understood that a non-self-starting effect can occur, in the conventional multivibrator shown in Fig. 1, if the supply voltage is applied with a rather slow rate of rise. Both transistors 12 and 14 may then be "on" simultaneously, and both may be saturated—i. e., additional base current causes little or no increase in collector current. Loop gain is less than one, and oscillation will not start.

Furthermore, it will be understood that, in the circuit of Fig. 1, the back resistances of the base-to-emitter and base-to-collector diodes of transistors 12 and 14 are loaded across the frequency-determining components 32, 33, 35, and 36. (Resistors 31 and 34 are in general much smaller than resistors 33 and 36 and have only a secondary effect on frequency.) This load varies greatly with temperature, and the frequency stability of the multivibrator suffers accordingly.

Figure 2:
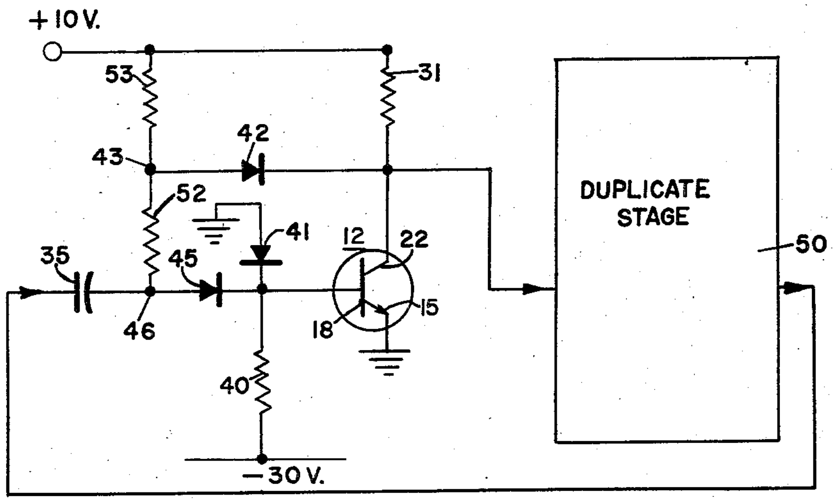
Figure 2 is a schematic diagram of an improved junction transistor multivibrator in accordance with my invention.

My circuit, one form of which is shown in Fig. 2, substantially eliminates these difficulties. Fig. 2 represents a two-stage multivibrator, but only one stage is shown in detail; it will be understood that duplicated stage 50 is identical to the first stage, comprising transistor 12 and associated components, which is shown in detail.

It will be noted that the circuit of Fig. 2 has several components not present in the conventional circuit of Fig. 1. A first diode 42 is connected in a feedback path between collector 22 and base 18. Whenever enough current flows in the collector circuit to cause the voltage at collector 22 to fall below that at point 43, diode 42 becomes conductive and applies negative feedback to base 18. This feedback prevents the collector circuit from becoming saturated and insures that oscillation will be self-starting when the supply voltage is applied. The use of negative feedback to prevent saturation of transistors in other circuits is known.

A second diode 45 is connected between input point 46 and base 18. It will be noted that the diodes 42 and 45 are so connected that they are conductive when transistor 12 is "on."

However, if duplicate stage 50 impresses a negative voltage on capacitor 35, diodes 42 and 45 both become nonconductive. This means that transistor 12 becomes isolated from the frequency-determining elements 35, 52, and 53. Sufficient current bias to keep transistor 12 cut off while diode 45 is nonconductive is applied to base 18 through resistor 40. A third diode 41, connected between base 18 and ground, prevents the voltage at base 18 from falling more than a fraction of a volt below ground potential.

After the negative voltage from duplicate stage 50 has been received by capacitor 35, the voltage at point 46 gradually rises again. When this voltage approximates ground potential, diode 45 starts to conduct again, and transistor 12 is again switched on—i. e., current flows again to collector 22. Collector 22 then supplies a negative-going output pulse to duplicate stage 50, which in turn supplies another negative pulse to capacitor 35, again switching off transistor 12, and so forth. Oscillation thus proceeds.

It is well known that point contact transistors, unlike junction transistors, may have an alpha greater than unity. This means that point contact transistors, unlike junction transistors, will provide one-stage multivibrator circuits. Such circuits are well known. It will be understood that, although I have described an embodiment of my invention using junction transistors, my invention is also applicable to two-stage multivibrators using new or different types of transistors or other devices having characteristics similar to those of junction transistors.

It will be apparent that the embodiment shown is only exemplary and that various modifications can be made in construction and arrangement within the scope of the invention as defined in the appended claims.

I claim:

1. In a transistor multivibrator circuit having at least one frequency-determining element, an improvement adapted to render the frequency of the multivibrator independent of transistor characteristics and temperature, said improvement comprising: at least one diode interposed between at least one transistor terminal and said frequency-determining element, said diode being nonconductive when the transistor is in the "off" condition, so that said termnial is effectively disconnected from said frequency-determining element when the transistor is in the "off" condition.

2. A self-starting temperature-insensitive transistor multivibrator having two stages, each stage comprising: a transistor having an emitter, a collector, and a base, said emitter being grounded; a frequency-determining resistance-capacitance network; and first and second diodes connected between said network and said collector and said base respectively, the polarity of the diodes being such that when the transistor is in the conductive state the diodes become conductive and complete a direct-coupled negative feedback path between the collector and the base thereby preventing saturation and such that when the transistor is in the nonconductive state the diodes become nonconductive and isolate the collector and the base from the frequency-determining network.

3. A transistor multivibrator having two similar stages, each stage comprising: a transistor having an emitter, a collector, and a base, said emitter being grounded; first and second supply voltage sources of opposite polarities with respect to ground; a first resistance connected between said first source and said collector; a second resistance having one end connected to said first source; a first diode connected between the other end of said second resistance and said collector; a third resistance having one end connected to the junction of said second resistance and said first diode; a second diode connected between the other end of said third resistance and said base; a capacitor having one end connected to the junction of said third resistance and said second diode, the other end of said capacitor being connected to receive from the other of said two stages periodic pulses opposite in polarity to said first source;

a fourth resistance connected between said second supply voltage source and said base to provide a bias current; and a third diode connected between said base and ground, the polarity of said third diode being such that the voltage at said base due to said bias current is limited to a small value; the polarity of said first and second diodes being such that when the transistor is in the conductive state said first and second diodes become conductive and complete a direct-coupled negative feedback path between the collector and the base thereby preventing saturation and such that when the transistor is in the nonconductive state said first and second diodes become nonconductive and isolate the collector and the base from said second and third resistances and from said capacitor.

4. In a two-stage transistor multivibrator, an improvement adapted to insure that said multivibrator will always start oscillating when appropriate supply voltages are applied, said improvement comprising: in each of said stages, a circuit path including at least one diode connected between the output and input of the stage, the polarity of the diode being such that the diode becomes conductive when the output current exceeds a critical value, the diode thereby closing said circuit path and applying sufficient direct-coupled negative feedback to the input of the stage to prevent the stage from becoming saturated when in the "on" condition.

References Cited in the file of this patent

"Article, Transistor Circuit Applications," pps. 171–173 of Electronics for August 1953.

Proceedings of the Symposium on the Application of Transistors to Military Electronics Equipment, published Nov. 24, 1953, "High-Speed Nonsaturating Flip-Flops," Carlson, pp. 299–305.